(12) United States Patent
Keshavarzi et al.

(10) Patent No.: US 7,787,292 B2
(45) Date of Patent: Aug. 31, 2010

(54) CARBON NANOTUBE FUSE ELEMENT

(75) Inventors: Ali Keshavarzi, Portland, OR (US);
Juanita Kurtin, Hillsboro, OR (US);
Janice C. Lee, Beaverton, OR (US);
Vivek De, Beaverton, OR (US); Tanay Karnik, Portland, OR (US); Timothy L. Deeter, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 412 days.

(21) Appl. No.: 11/824,321

(22) Filed: Jun. 29, 2007

(65) Prior Publication Data

US 2009/0003028 A1 Jan. 1, 2009

(51) Int. Cl.
*G11C 11/34* (2006.01)

(52) U.S. Cl. .............. 365/174; 365/161; 257/330; 257/300

(58) Field of Classification Search .......... 365/137, 365/174, 161; 977/876; 257/330
See application file for complete search history.

(56) References Cited

U.S. PATENT DOCUMENTS 7,102,951 B2  9/2006  Paillet et al. ............ 365/225.7
2003/0218492 A1  11/2003  Denham et al. ............ 327/525
2004/0119127 A1*  6/2004  Anazawa et al. ............ 257/428
2005/0056877 A1*  3/2005  Rueckes et al. ............ 257/300
2006/0139995 A1*  6/2006  Keshavarzi et al. ......... 365/177
2006/0263255 A1*  11/2006  Han et al. ............ 422/83
2007/0001220 A1*  1/2007  Tombler et al. ............ 257/330

OTHER PUBLICATIONS

U.S. Appl. No. 11/323,369, filed Dec. 29, 2005, entitled "Statistical Circuit Design With Carbon Nanotubes," by Shekhar Borkar, et al.
Jason H. Hafner, et al. "Catalytic Growth Of Single-Wall Carbon Nanotubes From Metal Particles," Jun. 1998, pp. 195-202.
Woong Kim, et al., "Synthesis of Ultralong and High Percentage of Semiconducting Single-Walled Caron Nanotubes," May 15, 2002, pp. 703-708.
Yiming Li, et al., "Preferential Growth of Semiconducting Single-Walled Carbon Nanotubes by a Plasma Enhanced CVD Method," Jan. 8, 2004, pp. 317-321.
Jing Kong, "Chemical Vapor Deposition of Methane for Single-Walled Carbon Nanotubes," Aug. 14, 1998, pp. 567-574.

* cited by examiner

*Primary Examiner*—Vu A Le
*Assistant Examiner*—Han Yang
(74) *Attorney, Agent, or Firm*—Trop, Pruner & Hu, P.C.

(57) ABSTRACT

In one embodiment of the invention, a fuse element for a one time programmable memory may include carbon nanotubes coupled to a first transistor node and to a second transistor node. The carbon nanotubes may have a first resistance which may be changed upon programming the memory cell with low current levels.

19 Claims, 2 Drawing Sheets

CARBON NANOTUBE FUSE ELEMENT

BACKGROUND

A fuse element may be used in an integrated circuit such as, for example, a one time programmable (OTP) memory. An example of a traditional fuse element is a polysilicon fuse. Polysilicon fuse elements may be "blown" or "programmed" by passing high current through the element until it encounters a thermal breakdown. A blown fuse may exhibit a resistivity that is, for example, 3-10 times higher than a "non-blown" or "unprogrammed" fuse element.

Traditional fuse elements like the polysilicon fuse element may require a high programming current (e.g., 100 mA). As a result, devices such as a vertical drain NMOS (VDNMOS) may be necessary to protect sensitive devices that may be damaged by the large programming current. Such protective devices may be large and result in a fuse cell that occupies a large silicon area (e.g., 1000 m$^2$). In addition, blowing a polysilicon fuse may be unreliable because it is not cumulative. In other words, if the fuse does not blow correctly, it cannot be further blown by reapplying the programming current or some variation of the programming current. As a result, a certain redundancy may be required to compensate for the fuses that do not initially blow correctly. Furthermore, the resistance differential between a blown and a non-blown polysilicon fuse is small. This may cause difficulties when designing a sensing scheme that can operate reliably despite process and temperature variations.

BRIEF DESCRIPTION OF THE DRAWINGS

The accompanying drawings, incorporated in and constituting a part of this specification, illustrate one or more implementations consistent with the principles of the invention and, together with the description of the invention, explain such implementations. The drawings are not necessarily to scale, the emphasis instead being placed upon illustrating the principles of the invention. In the drawings.

DETAILED DESCRIPTION

Figure 1:
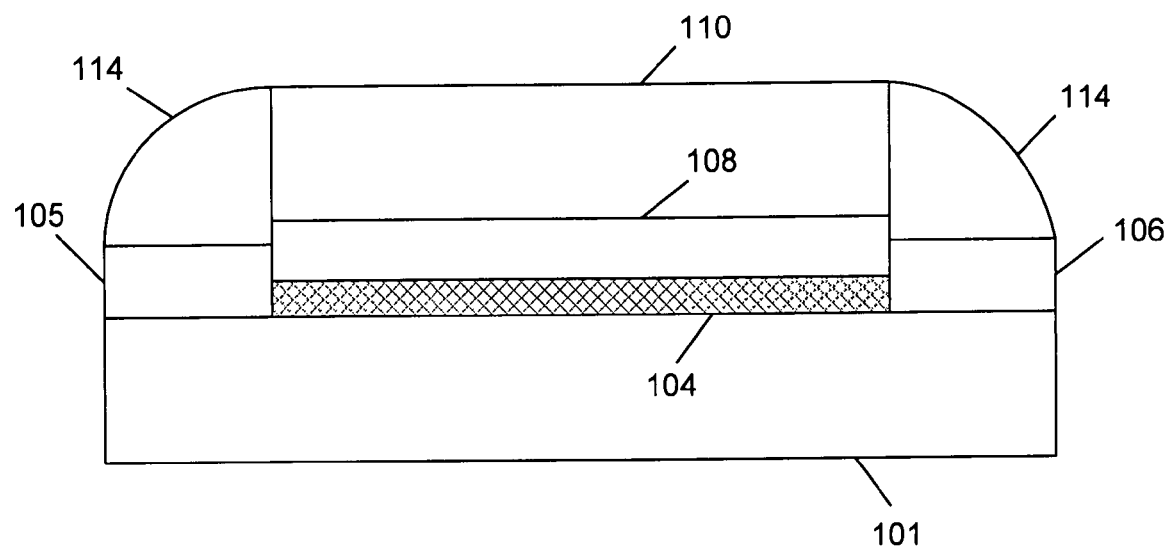
FIG. 1 is a cross-sectional view of a semiconductor device in one embodiment of the invention.

The following description refers to the accompanying drawings. Among the various drawings the same reference numbers may be used to identify the same or similar elements. While the following description provides a thorough understanding of the various aspects of the claimed invention by setting forth specific details such as particular structures, architectures, interfaces, and techniques, such details are provided for purposes of explanation and should not be viewed as limiting. Moreover, those of skill in the art will, in light of the present disclosure, appreciate that various aspects of the invention claimed may be practiced in other examples or implementations that depart from these specific details. At certain junctures in the following disclosure descriptions of well known devices, circuits, and methods have been omitted to avoid clouding the description of the present invention with unnecessary detail.

In one embodiment of the invention, single carbon nanotube (CNT) transistors (CNT FETs) may be arranged in an array of substantially parallel tubes, which are located in a transistor channel and coupled between the source and drain of the transistor. As will be discussed below, such an arrangement may constitute a fuse element that addresses many of the shortcomings of traditional fuse elements.

The CNTs may include both metallic and semiconducting CNTs depending on, for example, the methodology used to form the CNTs. In one embodiment of the invention wherein CNTs are grown by thermal chemical vapor deposition (CVD), approximately 70% of the CNTs may be semiconducting and approximately 30% of the CNTs may be metallic. In one embodiment of the invention where CNTs are grown using plasma enhanced CVD (PECVD) growth, approximately 90% of the CNTs may be semiconducting and approximately 10% of the CNTs may be metallic. Regardless, the mixed CNTs may couple nodes (e.g., source, drain, and/or gate) of a transistor to each other.

In one embodiment of the invention wherein a certain number (e.g., 100) of the CNTs are located in the transistor channel, the CNTs may operate as a short between the source and drain of the transistor. The transistor may then function as a fuse element. To program (i.e., blow) the fuse element, the semiconducting tubes can be depleted by applying a large potential between the source and drain of the transistor. The resultant large current in the metallic CNTs may burn them electrically. Once the metallic CNTs are blown, the current conduction in the channel may drop by, for example only, a factor greater than 100. Thus, an open fuse may be created. In one embodiment of the invention, such an open fuse may constitute a programmed cell in an OTP memory.

A CNT FET may have a significant resistance differential between a blown and a non-blown state. For example, the fuse current may lower from approximately 100 μA in a nonprogrammed state to approximately 1 μA in a programmed or blown state. This 100 fold current differential may allow for reliable sensing of the memory bit.

Furthermore, because a lower programming current (e.g., 100 μA) may suffice for a CNT FET fuse, a large protection device (e.g., VDNMOS) may be unnecessary to protect other devices that are, for example, coupled to the memory cell. As a result, the fuse cell may be smaller than fuse cells associated with more traditional fuse technologies (e.g., polysilicon fuse).

In addition, electrical breakdown or programming of metallic tubes may be cumulative. In other words, if the metallic tubes are not blown correctly on the first programming attempt, subsequent programming attempts may be made until the desired level of resistance or conductivity is achieved. Subsequent programming attempts may use the same programming voltage or different voltages. Furthermore, the length of application time of the programming voltage may be varied to adjust the resistance/conductivity. The cumulative nature of the CNT FETs may limit the need for extensive redundancy.

FIG. 1 is a cross-sectional view of a semiconductor device in one embodiment of the invention. Substrate 101 may be comprised of materials such as, but not limited to, silicon, silicon-on-insulator, germanium, indium antimonide, lead telluride, indium arsenide, indium phosphide, gallium arsenide, gallium antimonide, or combinations thereof. In one embodiment of the invention, the substrate 101 may be doped with p-type dopant.

A plurality of substantially randomly oriented CNTs 104 may be placed and/or formed on the substrate 101. The CNTs 104 may be formed by, for example, a CVD process utilizing a plurality of CNT seeds. As an example, 50 to 200 seeds may be used to yield a device with reliable electrical properties. In another embodiment of the invention, the CNTs 104 may be placed and/or deposited utilizing a spin-on process. In another embodiment of the invention, the CNTs may be stabilized in liquids by sonicating with surfactants, which may wrap the CNTs. The CNTs may then be separated out, placed on the substrate 101 and semi-aligned or aligned across the substrate 101 utilizing various alignment processes, such as a liquid based process including but not limited to electrophoresis. In one embodiment of the invention, an alignment process may comprise a gas flow and/or an electric field to substantially align the CNTs 104 to be oriented between a source 105 and drain 106. The alignment technique may be optimized to improve device performance, depending upon the particular application.

The source 105 and drain 106 may be formed on the substrate 101 and may be electrically coupled to the CNTs 104. The source 105 and drain 106 may be patterned using any suitable patterning technique, such as lithographic techniques. In one embodiment of the invention, the source 105 and drain 106 may be formed prior to the formation and/or placing of the plurality of substantially randomly oriented CNTs 204 on the substrate 200, depending upon the particular application.

A gate dielectric 108 may be formed on the plurality of CNTs 104 and on the source 105 and drain 106. The gate dielectric 108 may comprise a silicon dioxide layer or high k gate dielectric material. The gate dielectric 108 may comprise metal oxides such as hafnium oxide and/or lanthanum oxide, zirconium oxide, titanium oxide, and aluminum oxide for, example. In one embodiment of the invention, the gate dielectric 108 may have a thickness from about 10 Angstroms to about 150 Angstroms. In one embodiment of the invention, the gate dielectric 108 may comprise a dielectric material comprising a dielectric constant greater than about 10.

A gate electrode 110 may be disposed on the gate dielectric 108, thus forming a CNT device 100. The gate electrode 110 may comprise a metal gate electrode in one embodiment, or a polysilicon gate electrode in other embodiments. The CNT device may comprise at least one spacer 114.

Figure 2:
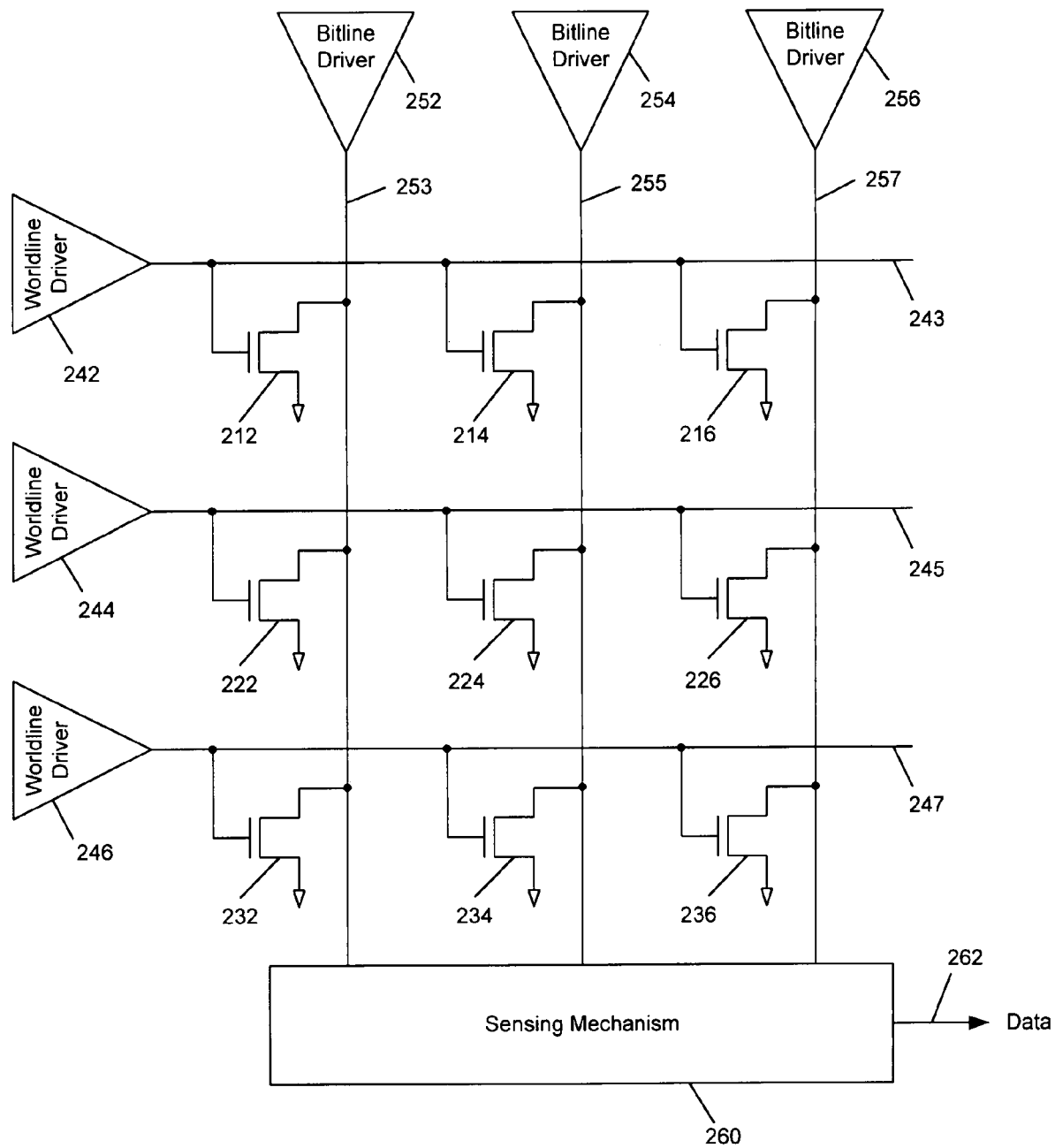
FIG. 2 is a schematic representation of a memory device in one embodiment of the invention.

FIG. 2 is a schematic representation of a memory device in one embodiment of the invention. More specifically, memory device 200 is an OTP that includes an array of memory cells with transistors coupled to wordlines and bitlines. The wordlines may be driven by wordline drivers, and the bitlines may be driven by bitline drivers. The bitlines may also be coupled to a sensing mechanism to sense the contents of the memory cells.

The array of transistors may include isolated gate transistors 212, 214, 216, 222, 224, 226, 232, 234, and 236. The wordline drivers may include wordline drivers 242, 244, and 246, and the bitline drivers may include bitline drivers 252, 254, and 256. Wordline driver 242 may drive wordline 243; wordline driver 244 may drive wordline 245; and wordline driver 246 may drives wordline 247. Bitline driver 252 may drive bitline 253; bitline driver 254 may drive bitline 255; and bitline 256 may drive bitline 257.

Each transistor in the array may be individually selected and "programmed" by causing, for example, CNT depletion or degradation as explained above. In traditional applications that may use, for example, a polysilicon fuse element, each of the transistors may be coupled to one bitline and one wordline, and may be programmed when a high voltage is present on the bitline and wordline. Such a voltage may be significantly higher than Vcc, such that the voltage application permanently changes the operating characteristics of the transistor. However, a CNT FET (e.g., 224), functioning as the fuse element, may be programmed when wordline driver 244 drives wordline 245 with a lower voltage, such as Vcc or lower. The bitline driver 254 may also drive bitline 255 with a lower voltage, such as Vcc or lower. More specifically, a lower programming current (e.g., 100 µA) may program the CNT FET fuse. The lower programming current may deplete or blow the semiconducting and/or metallic CNTs. This stands in contrast to the higher programming currents necessary to program traditional fuse elements.

Memory device 200 may be read by selecting a row of memory cells. For example, the row of memory cells corresponding to wordline 245 may be selected by wordline driver 244 driving an even lower voltage on wordline 245 than the aforementioned programming voltage. During this read cycle, wordline drivers 242 and 246 drive the even lower voltage to turn off the transistors in other rows. Transistors that have been programmed through CNT degradation will have a higher resistance than the unprogrammed transistors. For example, in the example above in which transistor 224 was programmed, transistor 224 would have a higher resistance than transistors 222 and 226. Of course, sensing current may be employed in one embodiment of the invention. Programmed transistors would pass lesser current (e.g., 1 µA) depending on the level to which they were programmed. In other words, the sensed current level may change according to amount of CNTs depleted during initial and/or subsequent programming attempts.

Sensing mechanism 260 may include circuitry to sense which of the bitlines are coupled to programmed cells and which bitlines are coupled to unprogrammed cells. For example, sensing mechanism 260 may include current sources, switches, current mirrors, comparators, or any other useful circuits. Sensing mechanism 260 may determine whether each cell holds a logical "1" or "0" based on whether the cell is programmed or not, and may output digital data at 262.

Again, in one embodiment of the invention, the CNT FET fuse element described herein may have multiple states beyond blown/not blown. For example, CNT FET's resistance could be progressively reduced a desired amount to come within one of the number of predefined value ranges corresponding to a number of states. The resistance could then be measured to determine the CNT FET's program state.

Various embodiments of the present invention may be used with an electronic system that may include a processor, OTP memory device, and static random access memory (SRAM) interconnected by a conductor. The processor may be any type of processing apparatus capable of communicating with the OTP memory device and, for example, SRAM. For example, a processor may be a microprocessor, a digital signal processor, a microcontroller, an application specific integrated circuit (ASIC), a memory controller, or the like.

In some embodiments, the processor and OTP memory may be separate devices that are combined when the electronic system is assembled. For example, the processor and OTP memory may be a separately packaged integrated circuits coupled to the same circuit board. In other embodiments, the processor and OTP memory may be included in the same package, or on the same integrated circuit die. For example, in some embodiments, OTP memory may be a microprogram control store included on the same integrated circuit die as processor. Also for example, in some embodiments, OTP memory may be a small read only memory used to hold a serial number or other identifying indicia for processor.

The type of interconnection between the processor, OTP memory, and SRAM is not a limitation of the present invention. For example, a conductor may be a bus, a serial interface, a test interface, a parallel interface, or any other type of interface capable of transferring information between the various devices.

Of course, OTP memory may be utilized in many different types of systems and applications that do not include SRAM. These systems may use dynamic random access memory (DRAM), Flash memory, or many other different types of memory.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    obtaining a one time programmable memory that includes a plurality of carbon nanotubes coupled to a first transistor node and to a second transistor node, the plurality of carbon nanotubes having a first resistance and including metal carbon nanotubes and semiconducting carbon nanotubes;
    applying a programming voltage to the plurality of carbon nanotubes to produce a programming current, the programmed plurality of carbon nanotubes having a second resistance;
    applying a testing voltage to the programmed plurality of carbon nanotubes to produce a testing current; and
    sensing the testing current.

2. The method of claim 1, wherein the programming current is less than 500 microamps.

3. The method of claim 2, wherein the testing current is less than 10 microamps.

4. The method of claim 1, further comprising:
    depleting the semiconductor carbon nanotubes based on the level of programming current previously used; and
    sensing the testing current based on the level of programming current previously used.

5. The method of claim 1, further comprising sensing the testing current to determine if the second resistance is greater than the first resistance.

6. The method of claim 1, wherein the plurality of carbon nanotubes, the first transistor node, and the second transistor node comprise a fuse.

7. The method of claim 1, further comprising applying an additional programming voltage to the programmed plurality of carbon nanotubes, the additionally programmed plurality of carbon nanotubes having a third resistance that is greater than the second resistance.

8. The method of claim 1, wherein the plurality of carbon nanotubes were formed using thermal chemical vapor deposition.

9. The method of claim 1, further comprising sensing the testing current to determine if the testing current is no more than 5% of the programming current.

10. An apparatus comprising:
    a fuse element that includes a plurality of carbon nanotubes to couple to a first transistor node and to a second transistor node, the plurality of carbon nanotubes to have a first resistance and to include a plurality of metal carbon nanotubes and a plurality of semiconducting carbon nanotubes.

11. The apparatus of claim 10, further comprising:
    a one time programmable memory that includes the fuse element;
    wherein the first transistor node is to couple to a first programming voltage during fuse element programming, the first programming voltage to be no greater than Vcc.

12. The apparatus of claim 11, further comprising a sense circuit to sense a state of the fuse element during sensing.

13. The apparatus of claim 12, further comprising:
    a fuse cell that is less than 10 $\mu m^2$;
    wherein the fuse cell comprises the sense circuit and the fuse element.

14. The apparatus of claim 10, wherein the plurality of semiconducting carbon nanotubes is greater than the plurality of metal carbon nanotubes and the plurality of carbon nanotubes includes no more than 125 carbon nanotubes.

15. The apparatus of claim 10, wherein the plurality of semiconducting carbon nanotubes is to be depleted based on a programming current applied to the plurality of carbon nanotubes, the programming current to be no greater than 300 microamps.

16. An apparatus comprising:
    a one time programmable memory that includes carbon nanotubes (CNTs) coupled to a first transistor node and to a second transistor node, the CNTs including metal and semiconducting CNTs and an unprogrammed resistance;
    wherein the memory is configured to be (a) programmed by coupling a programming voltage to the CNTs so the CNTs include a programmed resistance and (b) tested by applying a testing current to the CNTs to determine the programmed resistance is greater than the unprogrammed resistance.

17. The apparatus of claim 16, wherein the CNTs, the first transistor node, and the second transistor node comprise a fuse.

18. The apparatus of claim 16, wherein the programming voltage is to produce a programming current that is less than 125 microamps.

19. The apparatus of claim 16, wherein the number of semiconducting CNTs is greater than the number of metal CNTs.

* * * * *